(12) United States Patent
Mundry et al.

(10) Patent No.: US 7,238,055 B2
(45) Date of Patent: Jul. 3, 2007

(54) INDIVIDUAL CONTROLLER FOR SHIELD SUPPORT FRAMES

(75) Inventors: Sebastian M. Mundry, Lüdinghausen (DE); Jens Titschert, Lünen (DE); Jürgen Tschöpe, Selm (DE); Reiner Frank, Gevelsberg (DE)

(73) Assignee: DBH GmbH, Lünen (DE)

( * ) Notice: Subject to any disclaimer, the term of this patent is extended or adjusted under 35 U.S.C. 154(b) by 0 days.

(21) Appl. No.: 11/182,552

(22) Filed: Jul. 15, 2005

(65) Prior Publication Data

US 2006/0014439 A1    Jan. 19, 2006

(30) Foreign Application Priority Data

Jul. 16, 2004   (DE)   ................. 20 2004 011 226 U

(51) Int. Cl.
*H01R 25/00*   (2006.01)
(52) U.S. Cl. ...................................... 439/638
(58) Field of Classification Search ................ 439/638, 439/76.2, 63, 559; 174/50, 53, 371; 299/1.1, 299/1.4, 30
See application file for complete search history.

(56) References Cited

U.S. PATENT DOCUMENTS

| 3,951,490 | A | * | 4/1976 | Devendorf | 439/63 |
| 4,025,150 | A | * | 5/1977 | Nordberg et al. | 439/218 |
| D396,694 | S | * | 8/1998 | Shen | D13/147 |
| 6,210,179 | B1 | * | 4/2001 | Lausberg et al. | 439/76.1 |
| 2004/0087198 | A1 | * | 5/2004 | Decicco | 439/271 |

FOREIGN PATENT DOCUMENTS

DE          37 08 902 C3      3/1987

* cited by examiner

*Primary Examiner*—Alexander Gilman
(74) *Attorney, Agent, or Firm*—Baker & McKenzie LLP

(57) ABSTRACT

The present invention is an individual controller for shield support frames in underground mining, having a shallow box-shaped housing for holding microelectronics comprising a top wall, a bottom wall, two side walls, a front wall and a back wall, with receptacles for connecting cable plugs from sensors and actuators and with at least one socket for connecting a plug of a cable for communicating with an adjacent individual controller.

12 Claims, 3 Drawing Sheets

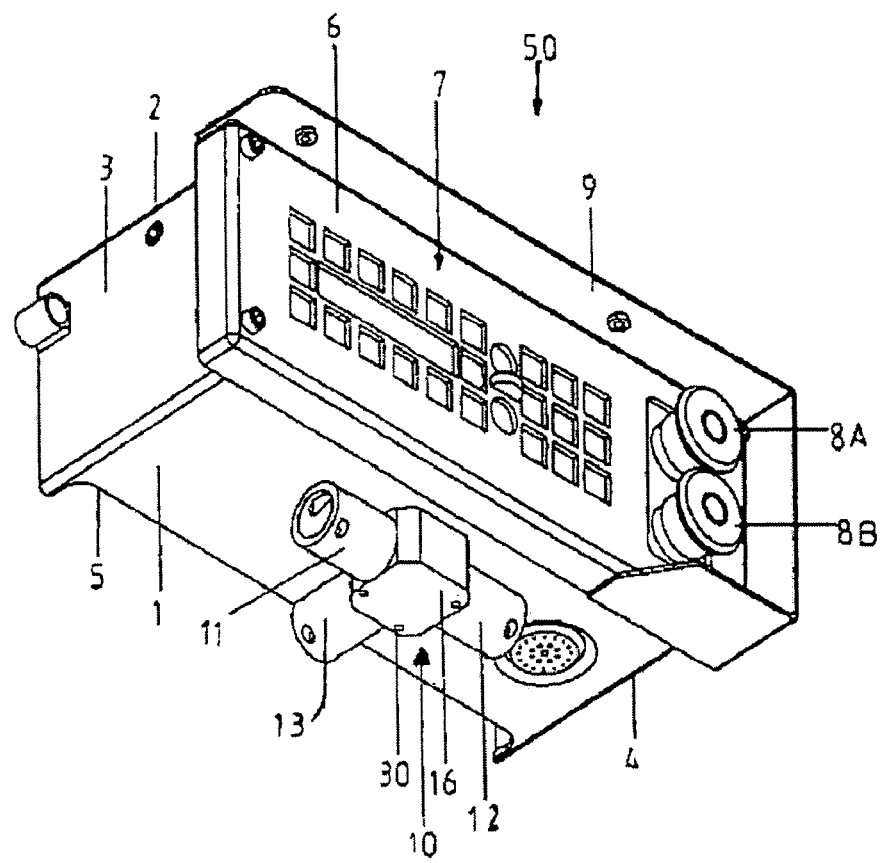
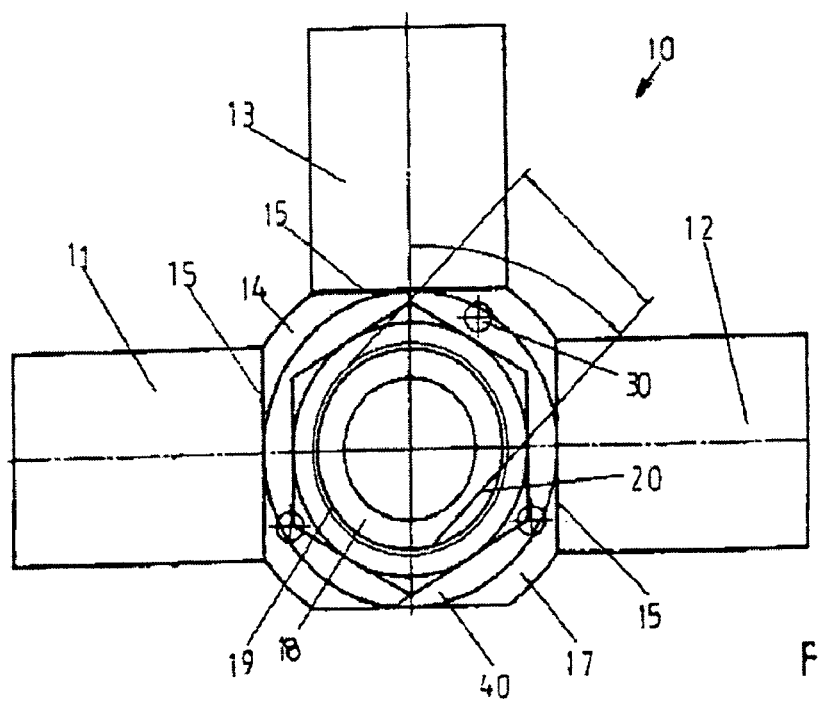

INDIVIDUAL CONTROLLER FOR SHIELD SUPPORT FRAMES

CROSS-REFERENCE TO RELATED APPLICATION

This application claims priority to German Patent Application No. 202004011226.4 filed on Jul. 16, 2004.

Such an individual controller is taught in DE 37 08 902 C3. In such an individual controller, receptacles for connecting cables from solenoid valves and other actuators, from sensors, and from connectors or sockets for cables for communicating with adjacent individual controllers are located at the back wall of the housing. In the known individual controller, the connection between the cable plugs and the back wall of the housing is made by way of a separate terminal block containing all the cable plugs, so that an individual controller may easily be detached from the designated terminal block at the support frame and replaced by another individual controller. In underground mining, cables are commonly designed as tubular cables, and plugs at the ends of the tubular cables are attached to the terminal block or to connectors using U-shaped connecting clamps. At the back wall of such an individual controller, for each plug there is one socket, inside of which there are contact pins and contact bushings, the socket having an O-ring at the outer perimeter thereof, in order to seal the connection between the terminal block and the individual controller against penetration by moisture when assembled. In the same fashion, all of the plugs on the tubular cables are provided with an O-ring, likewise so as to prevent penetration by moisture to the electrical contacts from the back side of the terminal block. The design having a terminal block that is used for such individual controllers has proved to be valuable, especially in the rough, damp climate found underground, and minimizes electrical failures. In some applications, however, connecting all of the tubular cables at the back wall of the individual controller has proved to be disadvantageous, notably because the cables for communicating with adjacent controllers must be bent with relatively small radii of curvature. Furthermore, the manufacturing costs for such individual controllers are high.

An object of the present invention is to provide an individual controller that can be manufactured at low cost and that enables improved cable connections, in particular for cables for communicating with adjacent controllers.

In the present invention, this objective is achieved by constructing a socket as a part of a connecting piece that has a hollow connecting stud, which passes through the upper wall, or more preferably the lower wall, of the housing, this connecting piece having at least a second socket for connecting a cable for communicating with adjacent individual controllers, electrical wires for connecting microelectronics with contact plugs in the sockets passing through a cavity in the connecting stud.

In the individual controller according to the present invention, the cables for communicating with adjacent controllers are not connected at the back side of the individual controller, but rather through an additional connecting piece comprising sockets at the exterior of the housing, and preferably disposed below the individual controller. An advantage of spatially separating the sockets for the tubular cables for communicating with adjacent controllers from the back wall is that the corresponding tubular cables may be led away to the side, or at an angle, rather than to the back. Meanwhile, these cables that lead to the adjacent frames no longer obstruct the connection of cable plugs for sensors and actuators, and depending on the orientation of the socket, a large radius of curvature or a straight lead-away is possible for the cables for communicating with adjacent frames.

In a preferred embodiment, when assembled, the connecting piece is positioned at the center, between the two side walls, of the bottom wall of the housing, and/or the sockets are positioned parallel to the bottom wall at the exterior of the housing. In order to produce a connection between the connecting piece and the housing in a manner that allows for simple manufacture, the connecting stud is preferably designed with a screw thread, and can be attached to the housing by way of a screw joint. It is particularly advantageous that a contact shoulder with a groove for holding a seal ring such as an O-ring be provided at the bottom of the connecting stud of the connecting piece. Thus, the O-ring, which is partially imbedded into the surface of the contact shoulder, can be pressed against the outer surface of the bottom side of the housing by means of the screw joint, allowing penetration by moisture to be simply prevented. The screw joint may be realized in a simple fashion using a washer and a nut, which is screwed onto the screw thread of the connecting stud.

According to an advantageous embodiment, the connecting piece has exactly two sockets for communicating cables, allowing bidirectional communication with adjacent individual controllers. The sockets may be oriented at angles of 90°, and particularly of 180°, to each other. In an embodiment wherein the sockets are oriented at 180° to each other, each socket may be oriented towards one of the two side walls, which is to say, towards an adjacent individual controller. In an embodiment wherein the sockets are oriented at 90° to each other, the connecting piece is preferably disposed so that each socket is oriented obliquely towards one of the side walls and the rear, so that both communication cables have identical radii of curvature.

In an alternative embodiment, the connecting piece may comprise three or more sockets. In an embodiment with three or four sockets, these sockets are preferably oriented at angles of 90° to each other. A third socket may notably be used for connecting special sensors, such as displacement or temperature sensors for pump stations, for an external emergency switch, for a power supply, or the like.

In all of the embodiments, the connecting piece preferably comprises a base, at the top side of which the connecting stud is integrated, and has mounting holes at the sides, in particular insertion holes, for subsequently attaching sockets in a detachable fashion. The base may be made from plastic or stainless steel. It is particularly advantageous that the sockets, which contain contacts (such as contact pins and contact bushings) for connecting cables for the bidirectional communication with adjacent controllers, be fastened in the mounting holes and sealed by way of O-rings, and/or that these be fixed in the sockets using a peg joint. In this manner all of the components can be manufactured separately and can be simply assembled with sufficient sealing against penetration by moisture. It is further advantageous that the cavity in the connecting stud or in the connecting piece be filled with a sealing compound, particularly after assembly of all of the contact pins, contact bushings and electrical wires, so that all open contacts between contact pins, contact bushings and electrical wires are embedded in the sealing compound. Consequently, it is preferable that the sealing compound be introduced into the cavity of the connecting piece after the sockets have been placed into and fixed in the mounting holes.

In order to further simplify the assembly and so as to reliably fix the connecting piece on the housing, the connecting stud is preferably provided with a groove or a flat section, shaped to correspond to a protrusion or a complementary flat section on a through hole in the bottom wall of the housing. The complementary flat sections or the groove ensure that the connecting piece can only be mounted and fixed on the housing in a specific, predetermined position.

Additional advantages and features of the present invention will be apparent from the following description of the embodiments that are schematically illustrated in the figures, wherein:

FIG. 1 is a perspective view of an individual controller according to the present invention, which has a connecting piece with three sockets attached at the bottom;

FIG. 2 is a top view of a disassembled connecting piece according to a first embodiment;

Figure 3:
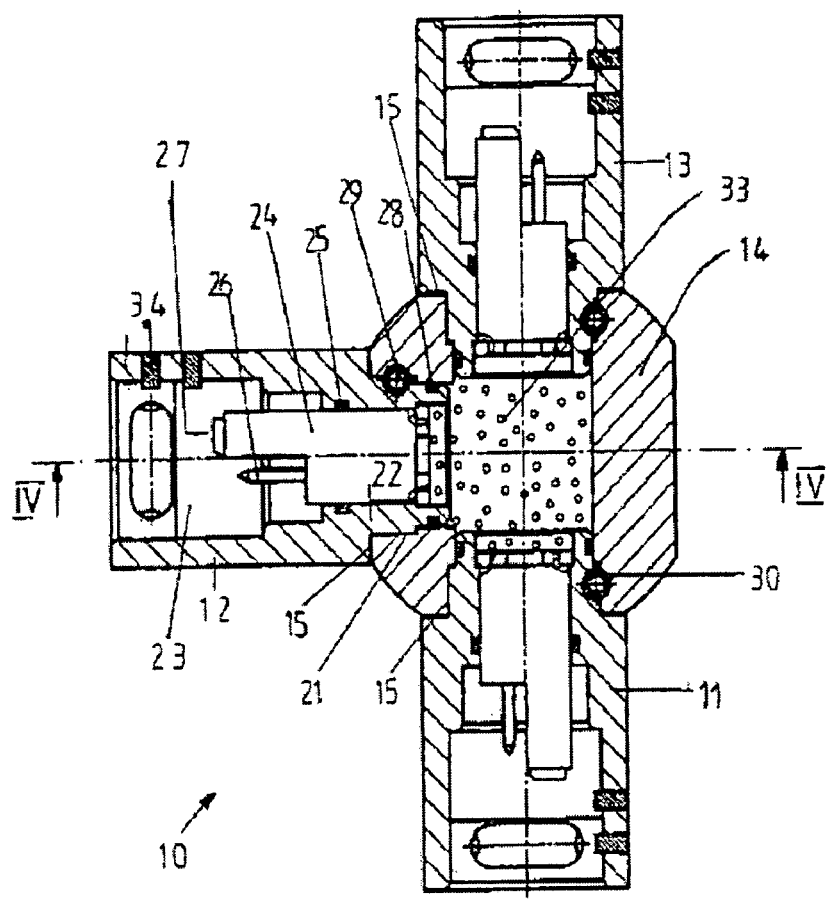
FIG. 3 is a horizontal sectional view of the connecting piece according to the first embodiment.

FIGS. 1 through 4 depict an individual controller 50 according to the present invention having a connecting piece 10 with three sockets 11, 12, 13 attached a bottom 1 thereof. The individual controller 50 according to the present invention is used as an electro-hydraulic support controller. The individual controller drives actuators such as electromagnets, which actuate hydraulic pistons and cylinders at the shield support frame (not depicted), scans sensors, which are associated with the individual hydraulic units, and/or performs other control tasks. The individual controller 50 comprises a housing having the shape of a shallow box and comprising a bottom wall 1, a top wall 2, two side walls 3 and 4, a back wall 5 and a front wall 6. A detachable front wall 6 houses a control panel 7, which is referenced collectively by reference numeral 7, an emergency switch 8A and a switch for locking against support removal 8B, all of which are easily accessible to the operator. By way of the control keypad 7, the functioning of the associated support frame may be controlled directly at the individual controller. The individual controller 50 is preferably attached to the bottom of a shield cap on the support frame. In the embodiment depicted, the front wall 6 of the individual controller 50 is connected to a sheet-metal housing by way of a screw joint, and all of the microelectronics (not depicted) including a display circuit board, a processor circuit board and an interface circuit board are contained therein and are connected to the detachable front wall 6. The front wall 6 of the individual controller 50 is provided with a forward-protruding border 9 for protecting the control panel 7 and the switches 8A and 8B. The cables that are connected to the actuators and sensors located in the shield support frame can be plugged into receptacles (not depicted) at the back 5 of the housing of the individual controller 50.

At an underground quarrying face, for the extraction of coal for instance, a variety of shield support frames are located side by side, with each shield support frame being equipped with an individual controller. So as to allow automated operations at the quarrying face, all individual controllers must communicate with each other, and communication between the individual controllers takes place via communication cables for communicating between the adjacent controllers, these cables being designed as relatively sturdy tubular electrical cables, in consideration of the explosion risk and the high humidity in underground mining. According to the present invention, the tubular cables for communicating with adjacent controllers are not plugged into receptacles or sockets located at the back of the individual controller. Instead, at the bottom 1 of the individual controller 50, a connecting piece 10 with a first socket 11 for a first tubular cable and a second socket 12 for a second tubular cable for communicating with adjacent controllers are provided for connecting the tubular cables to adjacent controllers. In the embodiment according to FIGS. 1 through 4, the connecting piece 10 comprises a third socket 13, to which an external emergency switch or the like may be connected. When the individual controller 50 is assembled on the support frame, one of the side walls 3, 4 of the housing faces towards the adjacent support frame and towards the individual controller attached thereto, the two sockets 11, 12 for communicating with adjacent controllers are oriented at an angle of 180° to each other and face towards the side walls 3 and 4, respectively, and thus to the adjacent support frames. However, the third socket 13 faces towards the back wall 5, so that the cable connected to the socket 13 is parallel to all the other cables.

The sockets 11, 12, 13 are of identical design, and the cables to be connected to the sockets are provided with plugs that may be inserted into the open cross section within the sockets 11, 12, 13 and then locked in this position by means of U-shaped clamps (not depicted). In the following, the design of the connecting piece 10 and the mounting thereof at the bottom wall 1 of the individual controller 50 is described in more detail, with reference to FIGS. 2 through 4, with only one of the sockets described in detail.

The connecting piece comprises a substantially cube-shaped base 14, with one of the sockets 11, 12, 13, respectively being attached at each of three of the four sides 15 of the base 14. The bottom 16 of the base 14 is closed, and a hollow connecting stud 18, which has a screw thread 19 at the perimeter thereof is provided at the opposite, top side. A nut 40 may be screwed onto the screw thread 19 of the connecting stud 18 in order to securely fix the connecting piece 10 against the bottom wall 1 of the individual controller (see FIG. 4) by way of the connecting stud 18 that protrudes through a through hole in the bottom wall. In order to protect the inside of the individual controller, which houses the microelectronics, against penetration by moisture, the top of the base 14 is provided with a contact shoulder 17, so that the connecting stud 18 protrudes beyond the shoulder 17, and the shoulder 17 has a groove 42 for an O-ring 43 at the bottom of the connecting stud. Upon tightening the screw 40, this O-ring 43, which is imbedded into the contact shoulder 17, is pressed against the exterior of the bottom wall 1 of the housing and thus seals the through hole in the bottom wall 1 for the connecting stud 18. Preferably, a washer 41 is inserted between the nut 40 and the bottom wall 1. In order to avoid assembly errors and to fix the connecting piece 10 so that it does not rotate relative to the bottom wall 1, the connecting stud 18 is provided with a flat section 20 (see FIG. 2), which fits a complementary flat section on the through hole in the bottom wall 1 (see FIG. 4) so that the connecting stud 18 may only be inserted fully into the through hole when the connecting piece 10 has a predetermined rotational orientation. At the same time, the complementary shapes of the flat sections 20 prevent the connecting piece at the bottom wall 1 from rotating.

Figure 4:
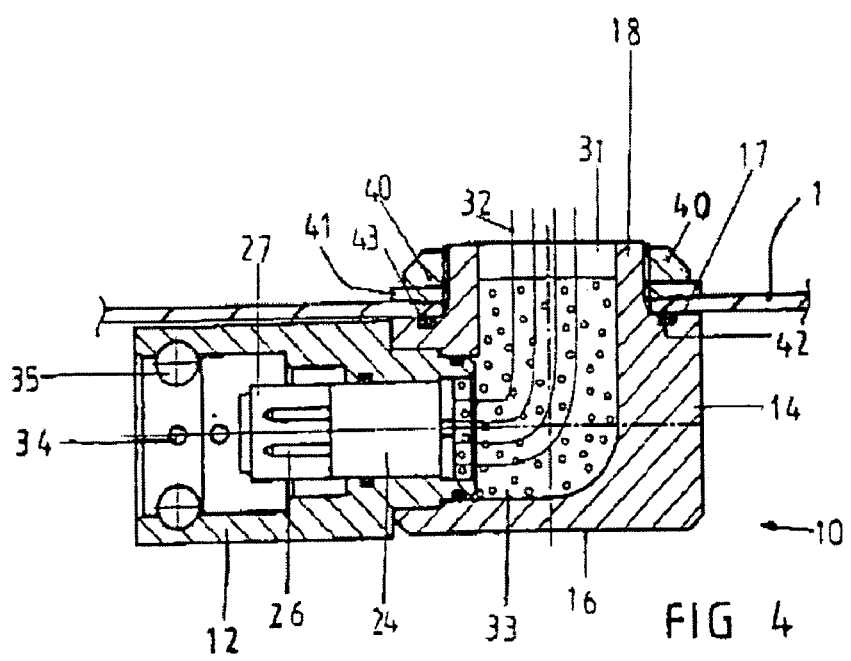
FIG. 4 is a sectional view according to the line IV—IV in FIG. 3, showing the connecting piece when assembled on the bottom wall of the housing.

From FIGS. 3 and 4 it is evident that all three sockets 11, 12, 13 are of identical design and are attached to the base 14 in an identical fashion. The sides 15 of the base 14 are provided with separate holes 21 for each socket 11, 12, 13, with a multi-stepped locking stud 22 for the sockets 11, 12, 13 being inserted into the hole 21. The sockets 11, 12, 13 are each provided with a through hole 23, and a contact plug 24, which is implemented as an SKK24 plug here, is located in the area of the locking stud 22 and sealed by means of an O-ring 25. The contact plug 24 comprises two open contact pins 26 as well as two contact bushings 27, with which contact plugs, which also comprise four contact terminals and which are attached to the tubular cables, can be electrically connected by inserting the plugs into the sockets 11, 12, 13. At the exterior of each locking stud 22 a groove for another O-ring 28 is provided, allowing the sockets 11, 12, 13 to be inserted into the holes 21, so that these are sealed and locked in a fixed state by a locking pin 29. The locking pins 29 are fully inserted into the holes 30 in the base 14, which are accessible from the bottom 16 of the base 14.

Furthermore, FIGS. 3 and 4 show that the base 14 of the connecting piece 10, as well as the connecting studs 18, are hollow at the interior, allowing the cavity 31, through which the electrical wires 32 for each of the contact plugs 24 of the sockets 11, 12, 13 are led, to be filled with a sealing compound 33. Filling with the sealing compound 33 is performed only after all of the sockets 11, 12, 13 have been attached to the base 14 by means of a locking pin 29, so that the sealing compound 33 may flow as far as the back sides of the contact plugs 24. In order to exactly position the plugs attached to the tubular cables, pins 34 protrude into the interior of the sockets 11, 12, 13, the pins 34 being complementary to grooves in the plug heads. Locking of the plug heads of the tubular cables for communicating with adjacent controllers is realized by U-shaped clamps, which are inserted into associated locking holes 35 and prevent the loosening of the plug heads that are inserted into the sockets 11, 12, 13.

Figure 5:
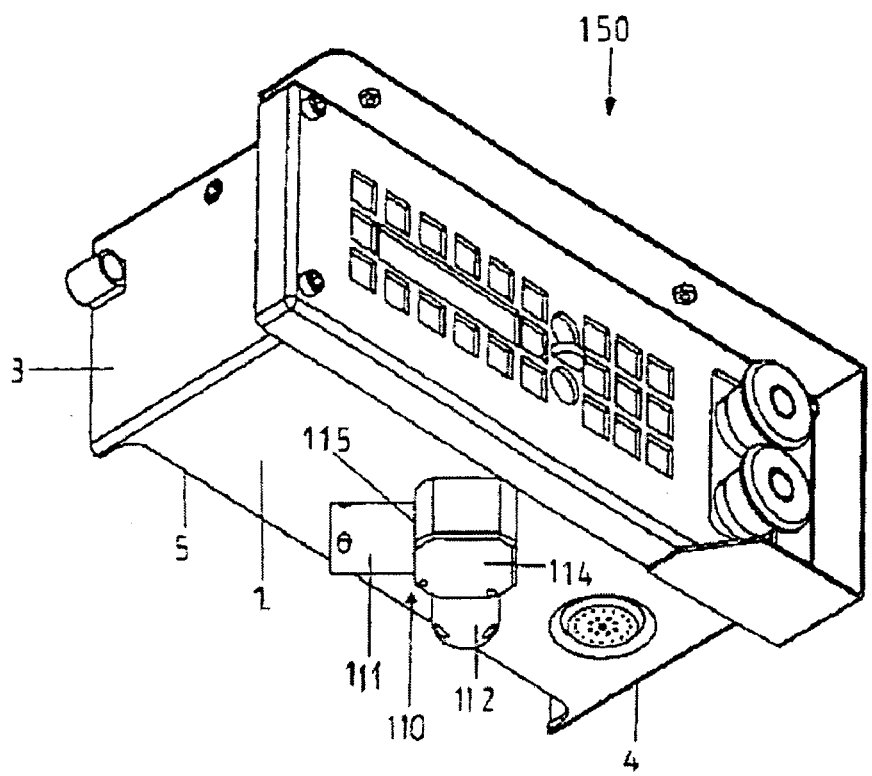
FIG. 5 is a perspective view of an individual controller having a connecting piece according to a second embodiment.

FIG. 5 shows an alternative embodiment of an individual controller 150 for controlling the functioning of shield support frames in underground mining. The actual housing of the individual controller 150 is substantially identical to that in the previous embodiment, and like parts are indicated by like reference numerals. The individual controller 150 is also provided with a connecting piece 110, which is located at the bottom wall 1 of the housing, and with sockets 111, 112 and 113 for the cables for communicating with adjacent controllers, which are located outside the housing, with the connecting piece 110 comprising, as in the first embodiment, a connecting stud (not depicted), which is fully inserted into a through hole in the bottom wall 1 of the housing, and which is securely fixed against the bottom wall 1 and sealed by means of an O-ring and a nut. In contrast to the first embodiment, the connecting piece 110 comprises only two sockets 111 and 112 exclusively for communicating with adjacent controllers. These two sockets 111 and 112 are oriented at an angle of 90° to each other and substantially face towards the corners between the side walls 3, 4 and the back wall 5 of the housing of the individual controller 150. Both sockets 111 and 112 are attached to two adjacent sides 115 of the base 114 of the connecting piece 110, as in the first embodiment. Due to the design of the connecting piece 110 in the form of an angular connecting piece with a 90° angle between the two sockets 111, 112, the two tubular cables for communicating with adjacent controllers may be led from the adjacent shield support frames to the individual controller 150 of the middle shield support frame with relatively large radii of curvature.

Figure 6:
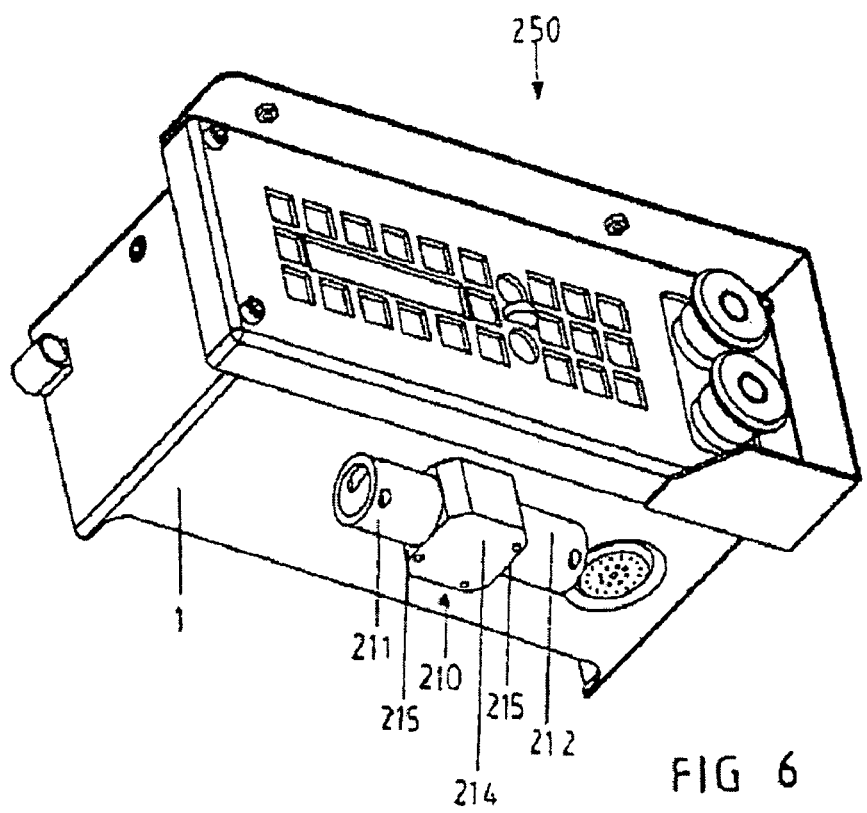
FIG. 6 is a perspective view of an individual controller having a connecting piece according to a third embodiment.

FIG. 6 depicts a third embodiment of an individual controller 250, comprising a housing with a design that is substantially identical to that of the first embodiment, and having a bottom wall 1 with a connecting piece 210, which again comprises only two sockets 211 and 212 for communicating with adjacent controllers. The two sockets 211 and 212 are positioned at an angle of 180° to each other and are attached at opposite sides 215 of the substantially cube-shaped base 214 of the T-shaped connecting piece 210.

Those skilled in the art will understand that numerous modifications can be made to that described above, without departing from the scope of the appended claims. It is understood that instead of a 180° angle or a 90° angle and a cube-shaped design for the base of the connectors, other geometric designs are also possible without departing from the scope of the appended claims. The attachment of the connecting stud and the connecting piece at the bottom wall of the housing may also be realized using a clamping ring engaging within a rotational groove on the connecting stud, a clamping clip or the like.

The invention claimed is:

1. A controller for a shield support frame, comprising:
   a shallow box-shaped housing having a top wall, a bottom wall, two side walls, a front wall, and a back wall;
   microelectronics located within the shallow box-shaped housing;
   at least one receptacle operable for connecting one or more cable plugs from at least one of sensors or actuators of the shield support frame;
   a connecting piece having a hollow connecting stud that protrudes and vertically extends through one of the top wall or the bottom wall of the housing;
   a first socket attached to the connecting piece and including a first contact plug for connecting at least one cable operable for communication with other individual controllers;
   a second socket attached to the connecting piece and including a second contact plug for connecting at least one cable operable for communication with other individual controllers; and
   at least one electrical wire for connecting the microelectronics with the first and second contact plugs of the sockets, the at least one electrical wire passing through the hollow connecting stud.

2. The controller of claim 1, wherein
   the connecting piece is located substantially in a center of the bottom wall and between the two side walls; and
   the first and second sockets are parallel to the bottom wall of the housing.

3. The controller of claim 1, wherein
   the connecting stud comprises a screw thread; and
   the connecting stud is attached to the housing using a screw joint.

4. The controller of claim 1, further comprising a peripheral contact shoulder having a receptacle groove for a seal ring, the peripheral contact shoulder being located on the connecting piece, wherein the seal ring includes an O-ring.

5. The controller of claim 1, further comprising one of one additional socket located on the connecting piece or two additional sockets located on the connecting piece, wherein
   the sockets are each oriented at an angle of substantially 90° to each other.

6. The controller of claim 1, further comprising three or more additional sockets each located on the connecting piece.

7. The controller of claim 1, further comprising a sealing compound, wherein
   the cavity in the connecting stud or in the connecting piece is filled with the sealing compound.

8. The controller of claim 1, further comprising:
a through-hole located in the bottom wall of the housing; and
at least one of a groove or a flat section located on the connecting stud, wherein
a shape of the groove or the flat section of the connecting stud corresponds respectively to at least one of a protrusion or a flat section on the through hole.

9. The controller of claim 1, wherein the connecting piece has two sockets.

10. The controller of claim 9, wherein
the sockets are oriented at one of an angle of substantially 180° or substantially 90° to each other.

11. The controller of claim 1, further comprising a base having a base top and at least two base sides, the base being located on the connecting piece, wherein p1 the top of the base is integrated with the connecting stud; and the base sides include at least one of mounting holes or insertion holes, the mounting holes or insertion holes being operable for attaching the sockets in a detachable fashion.

12. The controller of claim 11, wherein the sockets are inserted into one of the mounting holes or insertion holes; and the sockets are one of sealed with O-rings or fixed with locking pins.

\* \* \* \* \*